United States Patent [19]
Hutchison et al.

[11] Patent Number: 5,568,143
[45] Date of Patent: Oct. 22, 1996

[54] ANALOG TO DIGITAL CONVERSION SYSTEM HAVING AUTOMATICALLY AND DYNAMICALLY VARIABLE RESOLUTION RANGE

[75] Inventors: Robert J. Hutchison, Pittsford; John A. Teleska, Rochester, both of N.Y.

[73] Assignee: Lucid Technologies Inc, Henrietta, N.Y.

[21] Appl. No.: 330,399

[22] Filed: Oct. 27, 1994

[51] Int. Cl.⁶ .................................................. H03M 1/18
[52] U.S. Cl. ........................................ 341/139; 341/155
[58] Field of Search ................................. 341/139, 155, 341/118, 120, 140, 166

[56] References Cited

U.S. PATENT DOCUMENTS

| | | |
|---|---|---|
| 3,697,978 | 10/1972 | Prill . |
| 3,765,012 | 10/1973 | Grutzediek et al. . |
| 4,417,233 | 11/1983 | Inoue et al. . |
| 4,528,549 | 7/1985 | Simpson . |
| 4,535,319 | 8/1985 | Penney . |
| 4,734,677 | 3/1988 | Cake et al. . |
| 4,804,939 | 2/1989 | Cake et al. . |
| 4,908,621 | 3/1990 | Polonio et al. . |
| 4,965,578 | 10/1990 | Poujois . |
| 5,019,817 | 5/1991 | Ryder . |
| 5,117,227 | 5/1992 | Goeke . |
| 5,132,685 | 7/1992 | DeWitt et al. . |
| 5,173,698 | 12/1992 | Gulczynski . |
| 5,331,177 | 7/1994 | Kubisiak et al. ............. 250/574 |

Primary Examiner—Brian K. Young
Attorney, Agent, or Firm—M. Lukacher

[57] ABSTRACT

In order to digitize with sufficient resolution an analog signal, which may be generated by a photodetector in a spectrophotometer, an improved analog to digital conversion system is provided having an integrator stage, an analog to digital converter, a microprocessor and interface circuits for providing communication between the microprocessor and a host computer. The integrator may include an operational amplifier with a capacitor in feedback relationship therewith for providing an output which varies linearly as function of time. The microprocessor operates the analog to digital converter to sample the integrator output at successive increments of time which increase in accordance with a binary relationship to an increment corresponding in binary value to the desired upper end of the resolution range. The digitized samples from the analog to digital converter are compared with a predetermined value in the upper end of the amplitude range of the converter. Low amplitude analog signals do not reach the predetermined level until the later sampling times and thus are resolved at the upper end of the resolution range. Higher amplitude analog signals are resolved at the lower end of the resolution range. Thus the resolution dynamically and automatically increases inversely with the amplitude of the analog signal being digitized. The digitized value is expressed by two binary numbers, one corresponding to the number of samples until detection of the sample of the integrator output achieving the predetermined amplitude, and the other corresponding to the value which the integrated signal has achieved.

26 Claims, 2 Drawing Sheets

5,568,143

ANALOG TO DIGITAL CONVERSION SYSTEM HAVING AUTOMATICALLY AND DYNAMICALLY VARIABLE RESOLUTION RANGE

DESCRIPTION

The present invention relates to analog to digital conversion systems, and more particularly to an analog to digital conversion system having a digitization resolution range which varies to enable digitization of analog signals which may vary in amplitude over a wide amplitude range.

The invention is especially suitable for use in optical analyzing instruments, such as spectrophotometers, where analog signals generated by a photodetector can vary over an extremely large amplitude range and resolution of very low amplitude signals is desired. The digital signal is desirably digitized with a resolution range equal to the number of bits in a byte handled by a microprocessor of a computer utilizing a digitized data signal corresponding to the analog signal being measured, for example a resolution range of sixteen bits for sixteen bit microprocessors. The analog to digital conversion system provided by the invention has features of low cost, ease of calibration and the ability to be interfaced with a host computer which makes the system desirable for other applications wherever digitization of analog signals with high resolution over a large signal amplitude range is desired.

Optical instruments which use a photodetector ordinarily have a transconductance amplifier connected to the photodetector for converting the photocurrent corresponding to the illumination under test into an output voltage. In order to handle a wide amplitude range and thereby provide a wide dynamic range of operation, a network of resistors and switches are used. The network includes resistors of increasing value which are switched into the amplifier, for example to feed back current from the output to the input of the amplifier when the amplifier is of an operational or differential amplifier configuration. Higher value feedback resistors are needed to obtain an output voltage within a range which may be digitized by conventional analog to digital converter devices. In order to obtain accuracy precision resistors are required in the feedback network. Also accuracy of digitization is a necessary attribute of the analog to digital converter.

The complications and cost impact of switched feedback resistor network transconductance amplifiers and high accuracy digital converters is obviated in accordance with the invention while obtaining an extremely high dynamic range, for example a range between the lowest and highest value of a 28 bit binary number. An analog to digital converter is used in a system in accordance with the invention but that converter need not be accurate over the entire dynamic range, for example to obtain the 28 bit dynamic range only 12 bits of precision is needed.

Accordingly, it is the principal object of the present invention to provide an improved analog to digital converter system.

It is a more specific object of the invention to provide an improved analog to digital converter system which automatically adjusts its dynamic range and has a maximum dynamic range far exceeding the range of an analog to digital converter circuit which is used therein.

It is a still further object of the present invention to provide an analog to digital converter system which is especially suitable for use in digitizing signals from sensors which may be sensitive to effects which differ from each other by multiple orders of magnitude, such as photodetectors responsive to illumination which may vary in intensity between expected low and high magnitudes by multiple orders of magnitude.

It is a still further object of the invention to provide an improved analog to digital conversion system of high accuracy and wide dynamic range which may be implemented at low cost.

Briefly described, an analog to digital conversion system (method and apparatus), which may be provided in accordance with the invention and which can digitize analog signals which may vary over an amplitude range which may be $2^{16}$ higher at the upper end than at the lower end of the range, utilizes an integrator which integrates the analog signal. The integrated signal is sampled, as in a conventional digital to analog converter, at successive increments of time which increase in duration in accordance with a binary relationship. The sampling times may be controlled by a processor such as a microprocessor which is in command and control and data transfer relationship with a host computer. The microprocessor also counts the number of increments and provides a digital output representing the number of increments which is counted until detection of a digitized sample from the analog to digital converter which has an amplitude in the vicinity of the upper end of the range. The number of such samples (i.e., the count) is presented as a digital data signal representing the analog signal in digitized form. The number of bits of dynamic range is equal to the number of the bits which the analog to digital converter is capable of handling and the highest number of counts (number of samples). Thus the total dynamic range when a 12 bit digital to analog converter and a highest sample count of 16 is used is 28 bits. This dynamic range is automatically adjustable since it varies inversely with the amplitude of the analog signal being digitized because the integration time (the number of samples and successive increments) increases as the amplitude of the analog signal decreases.

The foregoing and other objects, features and advantages of the invention as well as a presently preferred embodiment thereof will be more apparent from a reading of the following description in connection with the accompanying drawings in which.

Figure 1:
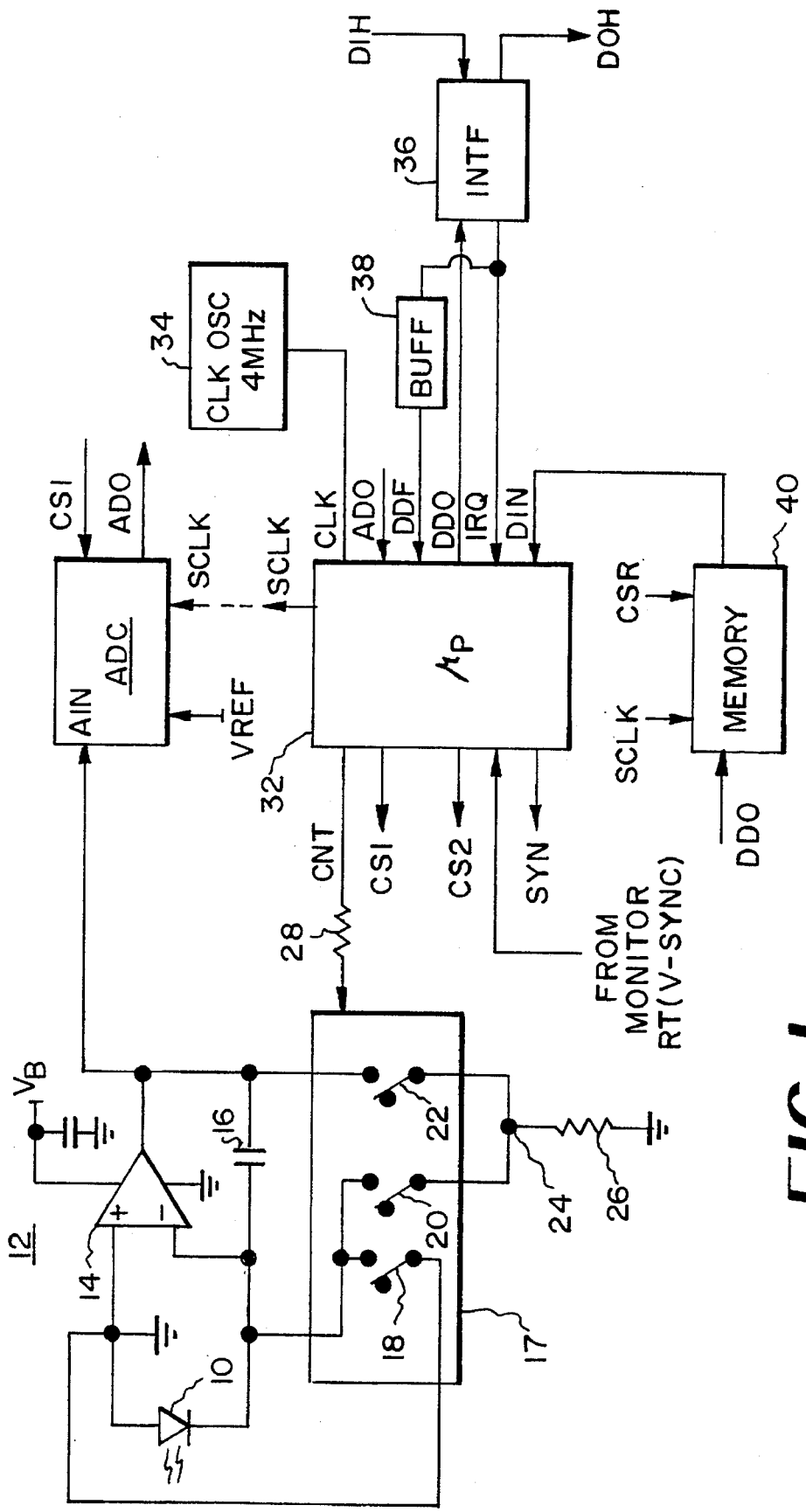
FIG. 1 is a block diagram schematically illustrating an analog to digital conversion system embodying the invention.

Referring to the drawings, there is shown a photodetector in the form of a PIN diode 10 which generates current photovoltaically in response to light incident on the photodetector. This photodetector is exemplary of sensors or signal generators which provide analog signals to be digitized in the system shown in FIG. 1. The photovoltaic current is integrated in an integrator 12 made up of an operational amplifier 14 and an integrating capacitor 16. Operating voltage for the amplifier 14 is obtained from a source $V_B$. A filter capacitor for example of approximately 1 microfarad capacitance is connected between $V_B$ and ground (the point of reference potential of the system). The $V_B$ voltage may be 3 volts and the so-called "rails" of the amplifier 14 are connected to $V_B$ and ground.

The summing junction of the integrator 12 the inverting input of the operational amplifier (marked with a minus). The direct or non inverting input is connected to ground. The amplifier 14 and the integrating capacitor 16 provide a linear ramp. The value of the capacitor is selected so that the charging time of the capacitor will be sufficient to develop a voltage equal to the integral of the input analog signal from the photodetector 10 for the smallest expected signal (or level of light incident on the photodetector) for the maximum charging interval. For example, this charging interval corresponds to 16 bits, as shown along the horizontal axis or abscissa of the plot shown in FIG. 3. Suitably, the integrating capacitor 16 may have a value of 220 pf (picofarads).

A switch array 17 which may be an integrated circuit switching device, suitably the Motorola semiconductor part number MC 14066 is connected to the integrator 12. The three switch elements 18, 20 and 22 of the switch array 17 are connected to the integrator 12. The switch element 18 is connected across the photodiode 10. The switch elements 20 and 22 are connected across the integrating capacitor 16. Their junction at 24 is connected to ground through a discharge resistor 26, suitably of 1 megohm resistance.

The integrated circuit switch device 17 is operated by a pulse CNT which is applied to its operating input via a buffer resistor 28. When CNT is asserted, the switch elements 18, 20 and 22, which are normally open, close. Then, the analog input from the sensor to the integrator is terminated. The capacitor 16 is discharged to ground through the discharge resistor 26. The discharge resistor 26 prevents current flow into the summing junction at the inverting input of the amplifier 14. CNT after assertion (at its trailing edge) causes the switch elements 18, 20 and 22 to resume their normally open state and establishes time zero for integration of the analog input signal. See FIG. 3 lower left corner.

The integrated analog input signal AIN is applied to an analog-to-digital converter (ADC) 30. ADC may be a commercial, low cost device which has a resolution range less than the resolution range which is desired from the analog to digital conversion system as a whole. For example, the ADC 30 may be a successive approximation type ADC having a 12 bit resolution range which provides a 12 bit output. The ADC is enabled to sample AIN by an enable signal CS1. CS1 when asserted opens the AIN input of the ADC, holds the valve at that instant, and starts the conversion under control of the system clock SCLK. The device 30 utilizes a voltage reference which may be a regulated voltage from a regulated supply of the conventional type (not shown). This reference voltage is indicated at $v_{REF}$. The system clock also outputs the digital signal, as a serial bit stream on ADO which may be a serial internal bus of the type used in microprocessor computer systems, such as an SPI bus. Each time when CS1 occurs, the integrated analog signal from the integrator is sampled. The ADC 30 may suitably be implemented by a MAX 189 ADC which is available for Maxim Integrated Products, 120 San Gabriel Drive, Sunnyvale, Calif.

CNT, CS1 and SCLK are provided by a programmed microprocessor 32. The microprocessor has a 16 bit resolution. The amplitude of the analog signal AIN is to digitized into a 16 bit binary digital signal. This microprocessor may for example be a type 68705 also available from Motorola Semiconductor Product and other sources. The microprocessor 32 receives timing from a clock oscillator 34, for example, at a stable, quartz controlled 4 MHz rate.

The microprocessor also receives the digital input ADO and can output the digitized signal on an output bus DDO as a string of serial bits. The output bus DDO is connected to an interface 36 which may be an interface chip, such as the MAX 232, which converts data output into RS 232 format and communicates with a host computer (not shown, by a commercial personal computer such as the IBM PS/1), which utilizes the digitized output DOH. The host computer also controls and provides digital input and programming data from the host on input DIH to a digital input port DDF of the processor 32, via a buffer stage 38, which may be a transistor buffer amplifier. The serial communication is simultaneously connected to an I/O pin and the IRQ of the microprocessor.

Figure 2:
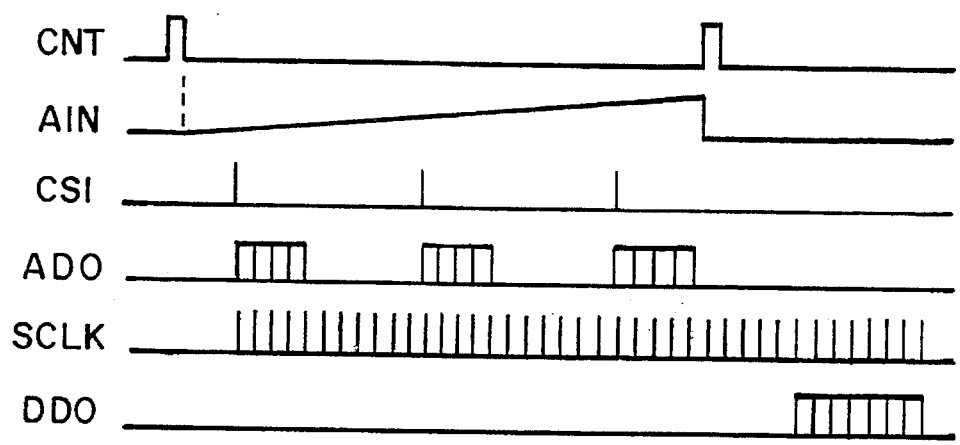
FIG. 2 is a timing diagram showing the timing of the signals appearing during the operation of the system shown in FIG. 1.

FIG. 2 illustrates the timing in the system. The initiation and end of integration; that is the start and end of the ramp voltage AIN representing the integrated analog signal is timed with the lagging edge and leading edge of successive CNT pulses. The samples of the analog integrated voltage (of the ramp AIN as shown in FIG. 2) result in the digital signals ADO which occur immediately after CS1. The sampling times when CS1 occurs are timed by the clock by counting successively greater numbers of clock pulses in the processor 32. Thus the successive sampling intervals or increments of time increase exponentially as shown for typical sampling times $T_1(2^0)$, $T^1(2^1)$, $T^1(2^2)$, $T_1(2^3)$ ... $T_1(2^{15})$. For example, $T_1$ may be a 100 microseconds from time zero. The sampling increments are then separated by intervals which are binarily related (increase binarily). Each successive increment is twice as long as its preceding increment. Thus the integration time starts with a sample taken 100 microseconds after CNT is deasserted so that integration can commence. The second sampling interval is 200 microseconds later, the third 400 microseconds later, the fourth 800 microseconds later and so forth until a count at the capacity of the program in the microprocessor chip 32 is reached. This timing is shown along the abscissa in FIG. 3.

The digital output representing the analog signal from the photodetector 10 is a count of each of the sampling pulses which occurs until the integrated analog voltage reaches a certain amplitude. If this amplitude is not reached by the time of the sixteenth pulse or at $T_1$ $(2^{15})$, CS1 is again asserted, and the integrating capacitor 16 is discharged and the analog signal to the integrator is short circuited by the switch element 16.

FIG. 2 shows the control pulses CNT, the integrated analog signal ramp AIN, which occurs until the third sampling pulse in the example shown in FIG. 1, that is the third CS1 pulse. After each CS1 pulse, the analog input level is digitized by the ADC 30 and a digital signal appears on ADO. All of the timing of the successive bits of ADO and of the digitized output from the microprocessor DDO is synchronous with SCLK, which may be derived in the microprocessor by dividing or counting down the pulses from the clock oscillator 34. SCLK may be 1 MHz.

In order to calibrate the system, a memory chip 40 such as an EEPROM, suitably a 4 kilobit EEPROM of the 9356 type, may be used. DDO may be stored in memory after light reflected from a standard black object, a white object and objects of certain standard colors are measured. The memory may be read out under control of an enabling signal CS2 so that the calibration data DIN is applied to the microprocessor and may be stored therein and read out via the DDO output line and the interface chip 36 to the host computer.

Figure 3:
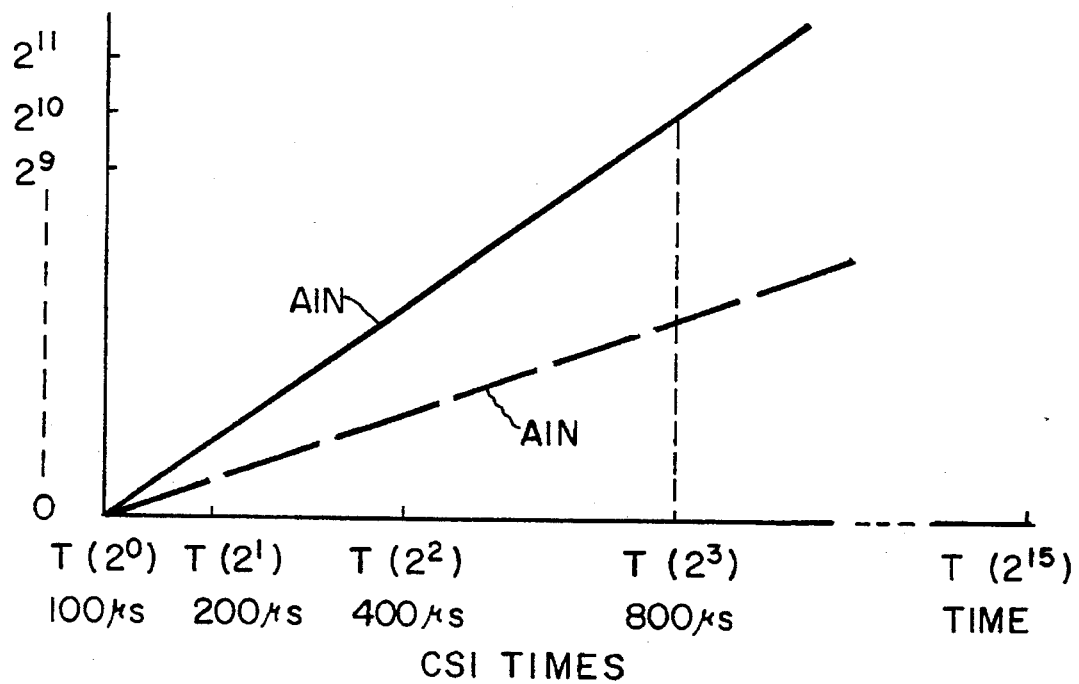
FIG. 3 is a graph of the variation of the integrated analog signal with time for two exemplary signals which are processed by the analog to digital conversion system shown in FIG. 1.

As shown in FIG. 3, the integrator provides linear integration so that the ramp voltage AIN is sampled at exponentially and particularly binarily related increments of time, 100 microseconds, 200 microseconds, 400 microseconds . . . in this example. When the integrated voltage (the amplitude of the ramp AIN) has exceeded a certain level, for example, which is ⅓ full scale of the ADC 30. The measurement is concluded and the count of the sample and the digitized integrated voltage are used to represent (a digitized version of) the analog input signal. The microprocessor provides the counting function. The slope of the ramp AIN is proportional to the analog signal level; that is the amplitude or intensity of the light incident on the photodetector 10. Since the slope changes with the amplitude, the resolution range in terms of the number of counts (up to a number having 16 bits (digits) of resolution) is therefore automatically and dynamically adjustable in its resolution. The system is therefore autoranging. When the analog signal level is low, more bits at the high end of the resolution range are provided in digitized output DDO from the system. In other words, the resolution varies inversely with the amplitude of the input analog signal, which is being digitized.

The microprocessor may be programmed to change the amplitude at the upper end of the range, after which the digitized output is obtained. For example, microprocessor may be programmed so that if the ADC 30 toggles at an ADO value corresponding to $2^{10}$ or a value greater or less than that value, within the resolution range of the ADC 30.

The total resolution range of the system may be represented by an exponential number having 2 binary numbers. The base 2 exponent may be a number corresponding to the number of counts (the number of CS1 pulses) until the ramp reaches a certain value (here in this example corresponding to a binary value exceeding $2^{10}$ from the ADC 30) and a mantissa which is equal to the digitized value (from the ADC 30) of the amplitude of the integrated analog signal from the integrator. The maximum number of bits of resolution for the illustrated system, using a 12 bit ADC 30, whose digitized result is stored in the mantissa, and a maximum sample count of 16, represented as the base 2 exponent, is 28 bits.

In the event that the photodetector is part of a spectrophotometer which is measuring the spectrum emitted from a video monitor, it is desirable to avoid integration of the analog signal when the screen is in retrace, either at the end of a line or at the end of a frame. Either horizontal or line retrace signals (h-sync) or vertical signals which occur in synchronism with the retrace of a frame (v-sync) may be applied from the monitor either directly to a DSYN input of the microprocessor 32 as shown or to a signal input of the host computer. Then a microprocessor utilizes the synchronizing signals as an interrupt signal to cause the generation of CNT and terminate the integration cycle upon occurrence of a retrace interval either at the end of a line or, more preferably, at the end of a frame, the latter occurring at 60 Hz rate in conventional video monitors.

From the foregoing description, it will be apparent that it has been provided an improved analog to digital conversion system. Variations and modifications in the herein described system and applications for digitizing analog signals from other and various sources than a photodetector or photovoltaic generator, as illustrated and described herein, will undoubtedly suggest themselves to those skilled in the art. Accordingly, the foregoing description should be taken as illustrative and not in a limiting sense.

We claim:

1. An analog to digital converter system for digitizing an analog signal over a resolution range which dynamically and automatically increases inversely with the amplitude of said analog signal, said converter system comprising an integrator of said analog signal which provides an output the amplitude of which changes with time, a sampler which takes samples of said output after each of a plurality of successive increments of time occurring until one of said samples of said output first becomes greater than a certain amplitude, a counter of the occurrence of said samples providing a digital signal representing in numerical value the number of said successive increments of time until said one of said samples occurs and defining said resolution range, thereby digitizing said analog signal over said resolution range.

2. An analog to digital converter system for digitizing an analog signal over a resolution range which dynamically and automatically increases inversely with the amplitude of said analog signal, said converter system comprising an integrator of said analog signal which provides an output the amplitude of which changes With time, a sampler which takes samples of said output after each of a plurality of successive increments of time occurring until one of said samples of said output first becomes greater than a certain amplitude, a counter of the occurrence of said samples providing a digital signal representing in numerical value the number of said successive increments of time until said one of said samples occurs, thereby digitizing said analog signal over said resolution range, and a switching device connected to said integrator settable into a first condition for initiating and enabling operation of said integrator to integrate said analog signal, said increments starting upon initiation of the operation of said integrator.

3. The system according to claim 2 wherein said switching device is resettable to a second condition inhibiting and disabling said integrator when said one of said samples which attains said certain amplitude is not taken after a certain number of said successive occurring increments.

4. The system according to claim 1 wherein said increments increase in duration non-linearly in accordance with the order of the digits in said numerical value.

5. The system according to claim 1 wherein said numerical value is binary and said increments increase in duration is binarily related.

6. The system according to claim 1 wherein said increments increase in time by a factor of $N^n$ where N is a constant and n changes in value for each increment.

7. The system according to claim 6 wherein N is an integer greater than 1 and n is a value in a series of values which increases by like integral units.

8. The system according to claim 7 wherein N equals 2 and n is a value in a series 0, 1, 2, 3, 4, 5 . . . q, where q is the highest number of integral units in said series.

9. The system according to claim 1 further comprising a sensor which generates a current as said analog signal which is integrated by said integrator.

10. The system according to claim 9 wherein said sensor is a photodiode.

11. The system according to claim 2 wherein said integrator comprises a capacitor and an input circuit to which said analog signal is applied for charging said capacitor, said switching device has switching elements connected across said input circuit and said capacitor.

12. The system according to claim 11 wherein said input charging circuit is an operational amplifier having direct and inverting inputs and an output, said analog signal being applied to at least one of said inputs and said integrated output being obtained at said output of said operational amplifier, said capacitor being connected in feedback relationship with said operational amplifier.

13. The system according to claim 12 wherein said feedback relationship is provided by connecting said capacitor between said output of said operational amplifier and the one of said inputs to which said analog signal is applied.

14. The system according to claim 13 further comprising a pair of said switching elements connected in series across said capacitor and defining a junction therebetween connected via a resistor to a point of reference potential.

15. The system according to claim 11 wherein said capacitor has a value selected to charge to said certain amplitude for the smallest amplitude analog signal to be digitized over an interval equal to the sum of all of said plurality of successive increments of time.

16. The system according to claim 1 wherein said certain amplitude and said numerical value represent the slope of the output of said integrator in terms of the change in amplitude of said output per unit time.

17. The system according to claim 1 further comprising apparatus constituting said sampler and said counter which provides an exponential value having an exponent and a mantissa representing said numerical value and said certain amplitude respectively.

18. The system according to claim 17 wherein said exponent and mantissa are separate binary data values.

19. The system according to claim 1 wherein said sampler and said counter are implemented by a digital processor which initiates integration by said integrator, generates sampling pulses at successive increments of time which increase in accordance with the binary relationship, and an analog to digital converter responsive to the output of said integrator for providing to said processor upon occurrence of each of said sampling pulses digital signals representing the samples of the amplitude of said integrator output, said counter being implemented in said processor for detecting when one of said digital signals representing said samples exceeds said certain amplitude and counting the number of said sampling pulses provides said numerical value in the form of a digital output signal from said processor.

20. The system according to claim 19 further comprising a host computer and means in said processor for communicating with said host computer for initiating digitization of said analog signal by enabling said integrator to integrate said analog signal and receiving said digital output signal.

21. The system according to claim 19 further comprising means for deriving said analog signal from the display of a video monitor which produces sync signals upon retrace intervals of lines and frames of said display, said processor having means for synchronizing the last of said successive increments with said sync signals produced upon occurrence of said retrace intervals of at least one of said lines and said frames.

22. The analog-to-digital converter system according to claim 1 wherein said integrator has means which provide said output amplitude change linearly with time.

23. The method of digitizing an analog signal to provide a digitized output sufficient to resolve signals which may have amplitudes over a wide amplitude range which can vary by a factor of $2^N$ where N can be a number exceeding 20 from the low to the high ends of said range, which method comprises the steps of integrating said analog signal, sampling the integral of the analog signal at successive increments of time, counting the number of said increments to provide a digitized output representing said number upon detection of a sample having an amplitude in the vicinity of the upper end of said range.

24. The method according to claim 23 wherein said increments increase in accordance with an exponential relationship.

25. The method according to claim 24 wherein said relationship is binary and equal to $2^n$ where n is the number of the increment.

26. The method according to claim 23 further comprising presenting said digitized output as an exponential value having an exponent which represents the number of said increment counted up to detection of said sample having said amplitude in the upper end of said range and a mantissa which represents said amplitude in the upper end of said range.

* * * * *